United States Patent
Pinarbasi

(10) Patent No.: US 6,353,518 B2
(45) Date of Patent: Mar. 5, 2002

(54) SPIN VALVE SENSOR HAVING ANTIPARALLEL (AP) PINNED LAYER STRUCTURE WITH LOW COERCIVITY AND HIGH RESISTANCE

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/881,174

(22) Filed: Jun. 14, 2001

Related U.S. Application Data

(62) Division of application No. 09/206,004, filed on Dec. 4, 1998.

(51) Int. Cl.[7] .................................................. G11B 5/39
(52) U.S. Cl. .................................................. 360/324.11
(58) Field of Search ........................ 360/324.11, 324.1, 360/324, 313, 314; 29/603

(56) References Cited

U.S. PATENT DOCUMENTS

| | | | |
|---|---|---|---|
| 3,983,916 A | 10/1976 | Henmi et al. ............... | 148/120 |
| 3,989,557 A | 11/1976 | Henmi et al. ............... | 148/120 |
| 5,227,193 A | 7/1993 | Hori et al. .................. | 427/131 |
| 5,484,491 A | 1/1996 | Iwasaki et al. ............. | 148/313 |
| 5,587,026 A | 12/1996 | Iwasaki et al. ............. | 148/313 |
| 5,731,936 A | 3/1998 | Lee et al. ................... | 360/113 |
| 5,742,162 A | 4/1998 | Nepela et al. .............. | 324/252 |
| 5,780,176 A * | 7/1998 | Iwasaki et al. ............. | 428/692 |
| 5,796,560 A * | 8/1998 | Saito et al. ................. | 360/113 |
| 6,090,480 A * | 7/2000 | Hayashi ...................... | 428/332 |
| 6,114,850 A * | 9/2000 | Hayashi ...................... | 324/252 |
| 6,144,524 A * | 11/2000 | Haratani et al. ............ | 360/113 |

FOREIGN PATENT DOCUMENTS

JP        5-36033        2/1993

\* cited by examiner

*Primary Examiner*—Craig A. Renner
*Assistant Examiner*—Angel Castro
(74) *Attorney, Agent, or Firm*—Ervin F. Johnston

(57) ABSTRACT

A spin valve sensor includes an antiparallel (AP) pinned layer that has first and second ferromagnetic layers separated by a thin coupling layer. The first ferromagnetic layer is exchange coupled to an antiferromagnetic pinning layer so that its magnetic moment is oriented in a first direction and the second ferromagnetic layer is exchange coupled to the first ferromagnetic layer with its magnetic moment oriented in a second direction that is antiparallel to the first direction. In the preferred embodiment the first ferromagnetic layer is cobalt iron niobium hafnium (CoFeNbHf) and the second ferromagnetic layer is cobalt (Co). With this arrangement the first ferromagnetic layer reduces current shunting and has a high coercivity so as to stabilize the pinning of the pinned layer. The cobalt (Co) of the second ferromagnetic layer enhances the spin valve effect by being adjacent to a nonmagnetic electrically conductive spacer layer which, in turn, is adjacent to a ferromagnetic free layer.

12 Claims, 14 Drawing Sheets

(ABS)

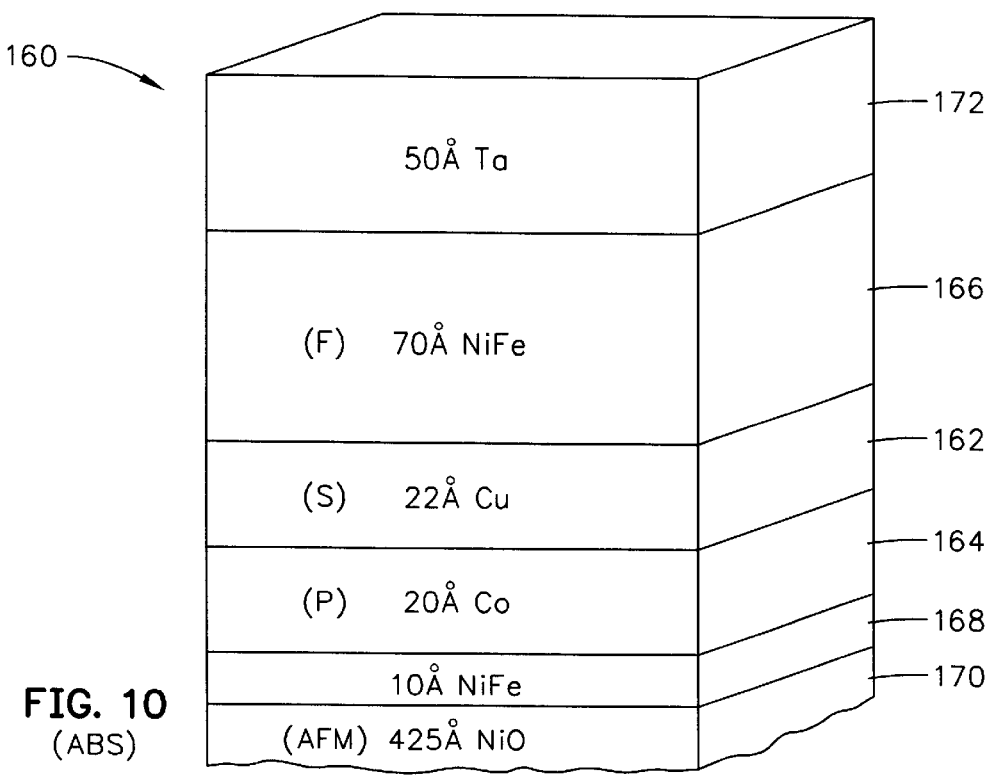
FIG. 10 (ABS)
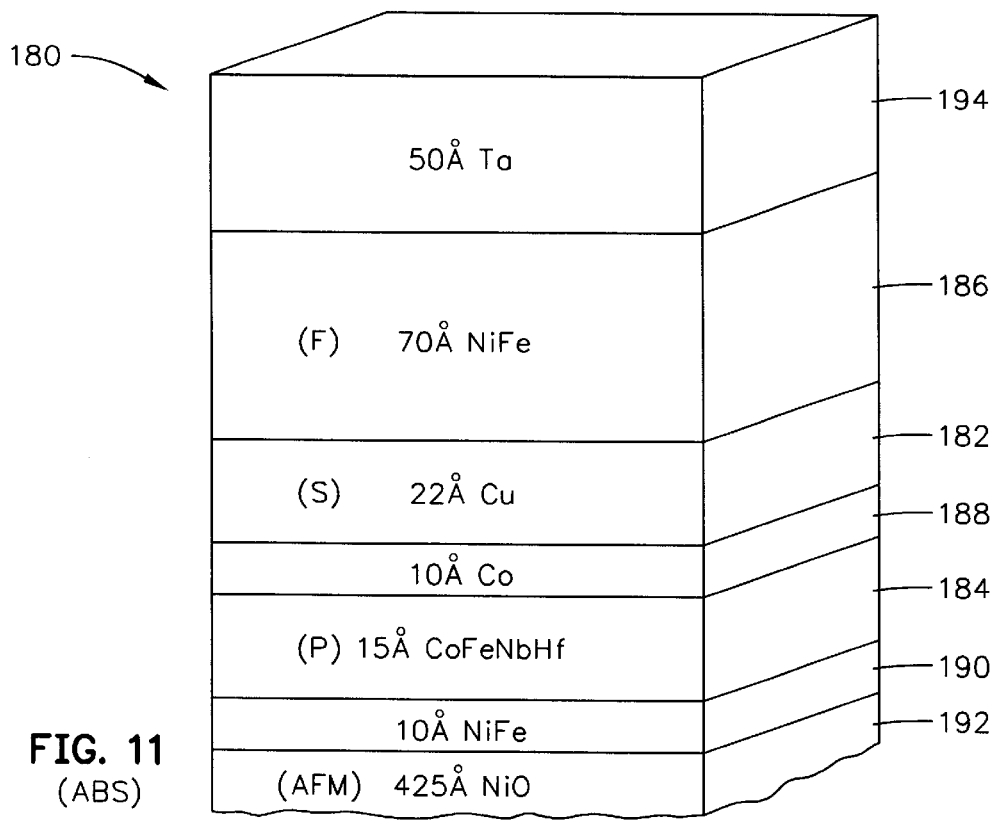
FIG. 11 (ABS)

(ABS)

(ABS)

(ABS)

(ABS)

(ABS)

(ABS)

(ABS)

(ABS)

(ABS)

SPIN VALVE SENSOR HAVING ANTIPARALLEL (AP) PINNED LAYER STRUCTURE WITH LOW COERCIVITY AND HIGH RESISTANCE

REFERENCE TO RELATED APPLICATION

This application is a divisional of application Ser. No. 09/206,004 filed Dec. 4, 1998.

BACKGROUND OF THE INVENTION

1. Field of the Invention

The present invention relates to a spin valve sensor with an improved antiparallel (AP) pinned layer and more particularly to an AP pinned layer that has reduced current shunting and lower coercivity.

2. Description of the Related Art

The heart of a computer is an assembly that is referred to as a magnetic disk drive. The magnetic disk drive includes a rotating magnetic disk, write and read heads that are suspended by a suspension arm above the rotating disk and an actuator that swings the suspension arm to place the read and write heads over selected circular tracks on the rotating disk. The read and write heads are directly mounted on a slider that has an air bearing surface (ABS). The suspension arm biases the slider into contact with the surface of the disk when the disk is not rotating but, when the disk rotates, air is swirled by the rotating disk adjacent the ABS to cause the slider to ride on an air bearing a slight distance from the surface of the rotating disk. When the slider rides on the air bearing the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head. The pole piece layers are connected at a back gap. Current conducted to the coil layer induces a magnetic field across the gap between the pole pieces. This field fringes across the gap at the ABS for the purpose of writing the aforementioned magnetic impression in tracks on moving media, such as in circular tracks on the aforementioned rotating disk.

In recent read heads a spin valve sensor is employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer, and a free layer. First and second leads are connected to the spin valve sensor for conducting a sense current therethrough. The magnetization of the pinned layer is pinned perpendicular to an air bearing surface (ABS) of the head and the magnetic moment of the free layer is located parallel to the ABS but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with the pinned and free layers. When the magnetizations of the pinned and free layers are parallel with respect to one another, scattering is minimal and when the magnetizations of the pinned and free layers are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetoresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. A spin valve is also know as a top or bottom spin valve depending upon whether the pinning layer is at the top (formed after the free layer) or at the bottom (before the free layer). A pinning layer in a bottom spin valve is typically made of nickel oxide (NiO).

Another type of spin valve sensor is an antiparallel (AP) spin valve sensor. The AP pinned spin valve sensor differs from the simple spin valve sensor, described above, in that the pinned layer of the AP pinned spin valve sensor comprises multiple thin layers, which are collectively referred to as an antiparallel (AP) pinned layer. The AP pinned layer has a ruthenium (Ru) spacer layer sandwiched between first and second ferromagnetic thin layers. The first ferromagnetic thin layer has its magnetic moment oriented in a first direction by exchange coupling to the antiferromagnetic pinning layer. The second ferromagnetic thin layer is immediately adjacent to the free layer and is antiparallel coupled to the first thin layer because of the minimal thickness (in the order of 8 Å) of the spacer layer between the first and second ferromagnetic thin layers. The magnetic moment of the second ferromagnetic thin layer is oriented in a second direction that is antiparallel to the direction of the magnetic moment of the first ferromagnetic layer.

The AP pinned layer is preferred over the single layer pinned layer. The magnetic moments of the first and second layers of the AP pinned layer subtractively combine to provide a net pinning moment of the AP pinned layer. The direction of the net moment is determined by the thicker of the first and second thin layers. The thicknesses of the first and second thin layers are chosen to reduce the net moment. A reduced net moment equates to a reduced demagnetization (demag) field from the AP pinned layer. Since the antiferromagnetic exchange coupling is inversely proportional to the net pinning moment, this increases exchange coupling between the first ferromagnetic film of the AP pinned layer and the pinning layer. The high exchange coupling promotes higher stability of the head. When the head encounters elevated thermal conditions caused by electrostatic discharge (ESD) from an object or person, or by contacting an asperity on a magnetic disk, the blocking temperature (temperature at which magnetic spins of the layer can be easily moved by an applied magnetic field) of the antiferromagnetic layer can be exceeded, resulting in disorientation of its magnetic spins. The magnetic moment of the pinned layer is then no longer pinned in the desired direction. A reduced demag field also reduces the demag field imposed on the free layer which promotes a symmetry of the read signal. The AP pinned spin valve sensor is described in commonly assigned U.S. Pat. No. 5,465,185 to Heim and Parkin which is incorporated by reference herein.

The first and second ferromagnetic layers of the AP pinned spin valve sensor are typically made of cobalt (Co). Unfortunately, cobalt has high coercivity, high magnetostriction and low resistance. When the first and second ferromagnetic layers are formed they are sputtered deposited in the presence of a magnetic field that is oriented perpendicular to the ABS which sets the easy axis (e.a.) of the ferromagnetic films perpendicular to the ABS. During operation of the head the AP pinned layer is subjected to extraneous magnetic fields that have components parallel to the ABS, such as components of the write field. These extraneous fields, combined with heating of the pinning layer, can cause the pinning layer to lose its pinning strength (exchange coupling) and allow the magnetic moments of the ferromagnetic layers to switch from being perpendicular to the ABS to some other direction. If the coercivity of the ferromagnetic films is higher than the exchange field that urges the magnetic moments of the ferromagnetic layers back to their original positions the magnetic moments of the ferromagnetic layers will remain in the wrong direction. This renders the read head inoperable.

Cobalt (Co) has a high negative magnetostriction. The negative sign determines the direction of any stress induced anisotropy. When a magnetic head is lapped, which is a grinding process, nonuniform compressive stresses occur in the layers of the sensor. Because of the magnetostriction and the stresses the cobalt (Co) ferromagnetic films acquire a stress induced anisotropy that is parallel to the ABS. This is the wrong direction. The stress induced anisotropy may rotate the magnetic moment of the first and second ferromagnetic layers of the AP pinned layer to some extent from perpendicular to the ABS in spite of the exchange coupling field tending to maintain the perpendicular position. This condition can cause read signal asymmetry.

The low resistance of the cobalt (Co) ferromagnetic films of the AP pinned layer causes a portion of the sense current to be shunted past the free and spacer layers. This causes a loss of read signal.

Efforts continue to increase the spin valve effect of GMR heads. An increase in the spin valve effect equates to higher bit density (bits/square inch of the rotating magnetic disk) read by the read head. Promoting read signal symmetry is also a consideration. This is accomplished by reducing the magnetic influences on the free layer. A search still continues to lower the coercivity, substantially eliminate magnetostriction and increase the resistance of some of the critical layers of the spin valve sensor.

SUMMARY OF THE INVENTION

The present invention provides a material for the pinning layer that has higher resistivity and lower coercivity than the cobalt (Co) material typically employed in the pinning layer. This material is selected from the group comprising cobalt iron niobium hafnium (CoFeNbHf), cobalt iron niobium (CoFeNb), cobalt iron hafnium (CoFeHf) and cobalt niobium hafnium (CoNbHf) wherein the preferred atomic weight percentage of CoNbHf is 87/11/2. The preferred material is cobalt iron niobium hafnium (CoFeNbHf). While cobalt (Co) has a resistivity of 10–12 ohms cm, cobalt iron niobium hafnium (CoFeNbHf), has a resistivity of 110 ohms cm. Further, while cobalt (Co) has a coercivity of 50–200 Oe, cobalt iron niobium hafnium (CoFeNbHf) has a coercivity of 5–10 Oe wherein the atomic weight percentages were 86.5/0.5/11/2.

As mentioned hereinabove, the AP pinned layer has first and second ferromagnetic layers separate by a very thin ruthenium (Ru) layer. The first ferromagnetic layer is exchange coupled to the pinning layer with its magnetic moment oriented in a first direction and the second ferromagnetic layer is exchange coupled to the first ferromagnetic layer with its magnetic moment oriented in a second direction antiparallel to the first direction. In a preferred embodiment the first ferromagnetic layer is cobalt iron niobium hafnium (CoFeNbHf) and the second ferromagnetic layer is cobalt (Co). With this arrangement the first ferromagnetic layer will reduce current shunting and have a lower coercivity to stabilize pinning of the pinned layer. Cobalt (Co) is a preferred material for the second ferromagnetic layer since it enhances the spin valve effect by being adjacent to the spacer layer. In some arrangements, however, it may be desirable for the second ferromagnetic layer to be cobalt iron niobium hafnium (CoFeNbHf).

In still other embodiments of the invention one or both of the first and second ferromagnetic layers may have first and second films where one of the films is cobalt (Co) and the other film is cobalt iron niobium hafnium (CoFeNbHf). The invention is applicable to top or bottom spin valve sensors. In a top spin valve sensor the pinned layer is pinned by a pinning layer at the top of the sensor (pinning layer is closer to the write head than the pinned layer) and in a bottom spin valve sensor the pinned layer is pinned by a pinning layer that is at the bottom of the sensor pinning layer is (further away from the write head than the pinned layer). In a bottom spin valve sensor nickel oxide (NiO) is typically employed for the pinning layer. In this type of sensor a nickel iron (NiFe) interface layer is employed between the pinning layer and the pinned layer for the purpose of promoting exchange coupling. Still further, in some embodiments of the invention a spin valve enhancement layer is employed. The spin valve enhancement layer is a very thin layer of cobalt (Co), such as 10 Å, that is located between and interfaces each of the spacer layer and the pinned layer. The invention can also be employed for simple spin valve sensors where a single pinned layer is employed.

An object of the present invention is to provide material for a pinned layer for a spin valve sensor that has higher resistivity and lower coercivity than prior art materials employed for pinned layers.

Another object is to provide a spin valve sensor that has improved pinned layer stability in the presence of extraneous fields.

A further object is to provide an AP pinned spin valve sensor wherein a first ferromagnetic layer antiparallel coupled to the pinning layer has high resistivity and low coercivity and a second ferromagnetic layer interfacing the spacer layer is cobalt (Co) for promoting a GMR effect.

Other objects and advantages of the invention will become apparent upon reading the following description taken together with the accompanying drawings.

BRIEF DESCRIPTION OF THE DRAWINGS

FIG. 10 is an isometric ABS illustration of a first investigated simple spin valve sensor;

FIG. 11 is an isometric ABS illustration of the present simple spin valve sensor;

DESCRIPTION OF THE PREFERRED EMBODIMENTS

Magnetic Disk Drive

Figure 1:
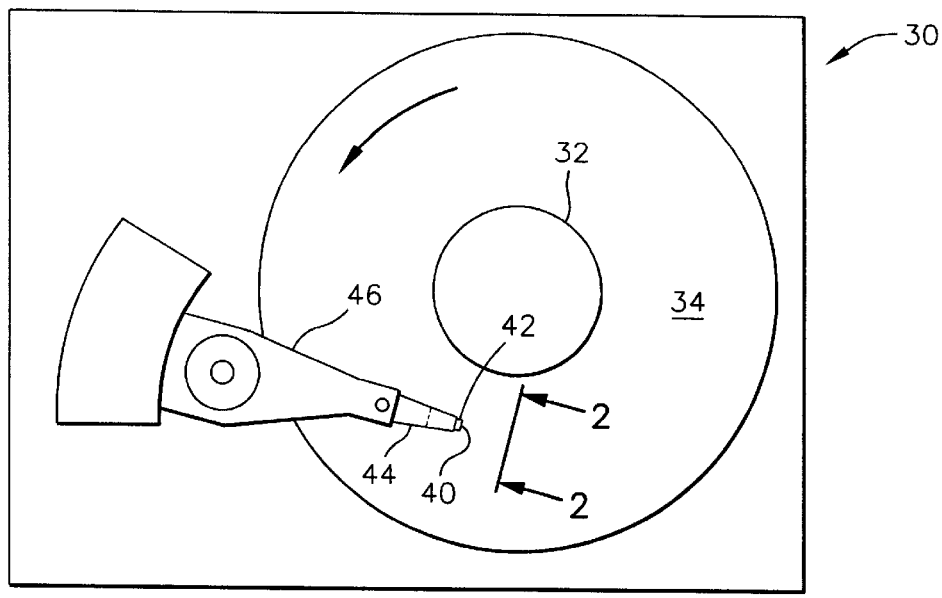
FIG. 1 is a planar view of an exemplary magnetic disk drive.
Figure 2:
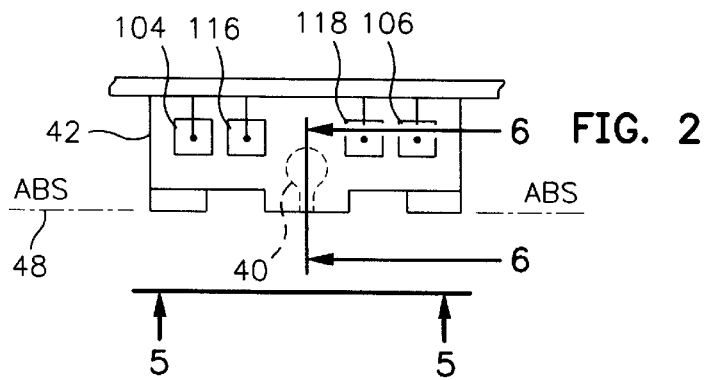
FIG. 2 is an end view of a slider with a magnetic head of the disk drive as seen in plane 2—2.
Figure 3:
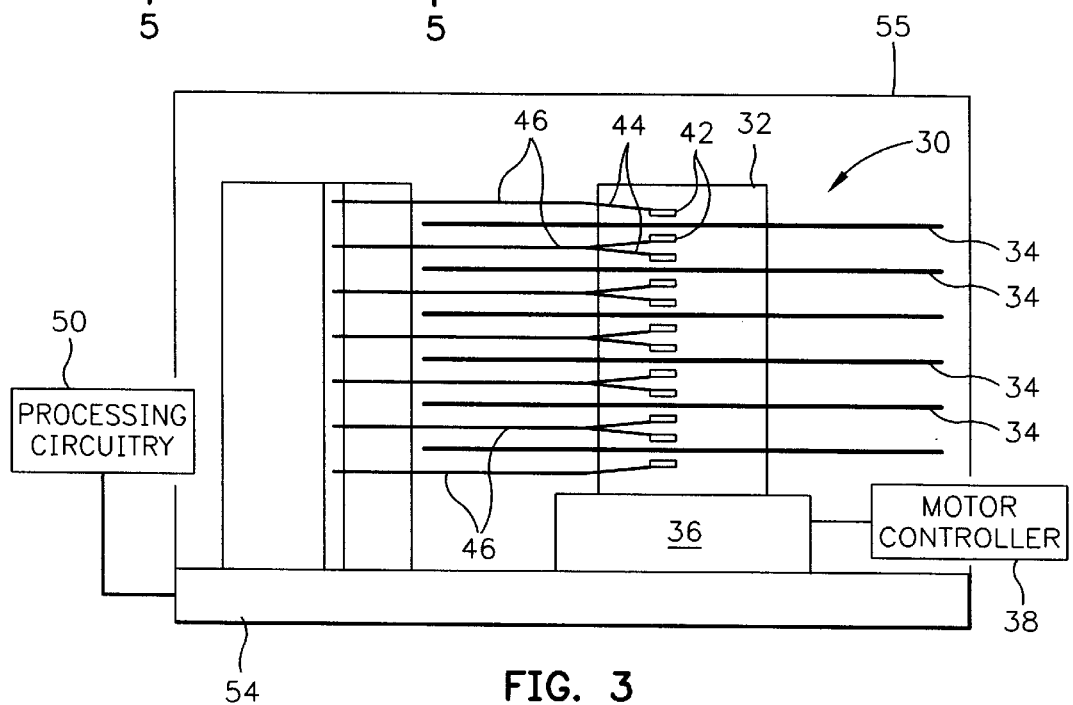
FIG. 3 is an elevation view of the magnetic disk drive wherein multiple disks and magnetic heads are employed.
Figure 4:
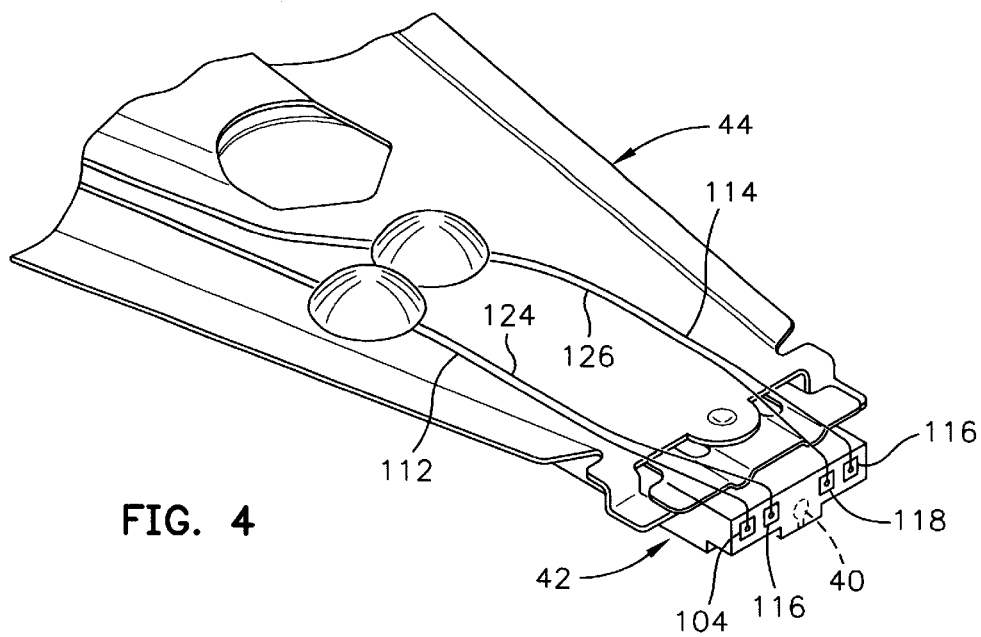
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A combined read and write magnetic head 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted to a suspension 44. The components described hereinabove may be mounted on a frame 54 of a housing 55, as shown in FIG. 3.

Figure 5:
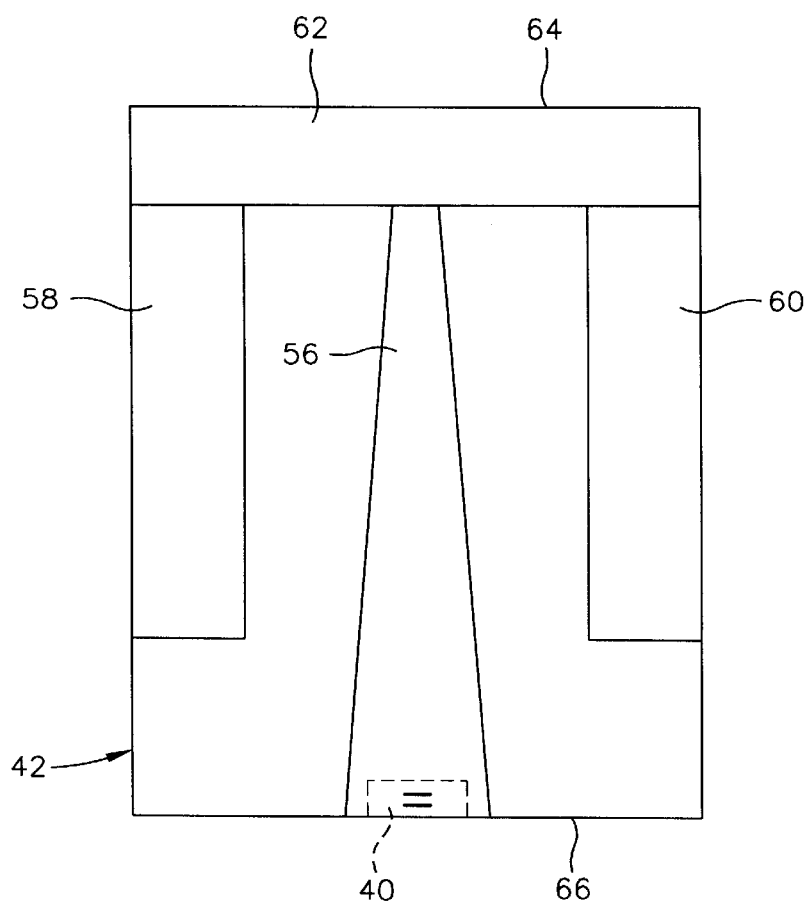
FIG. 5 is an ABS view of the slider taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
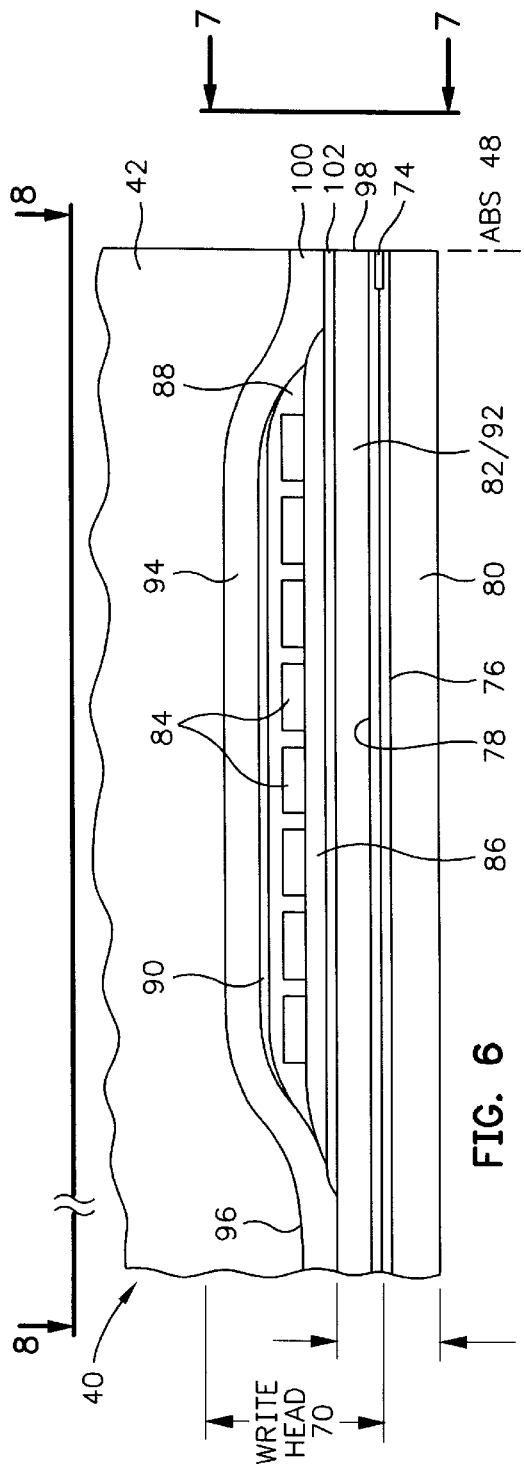
FIG. 6 is a partial view of the slider and magnetic head as seen in plane 6—6 of FIG. 2.
Figure 7:
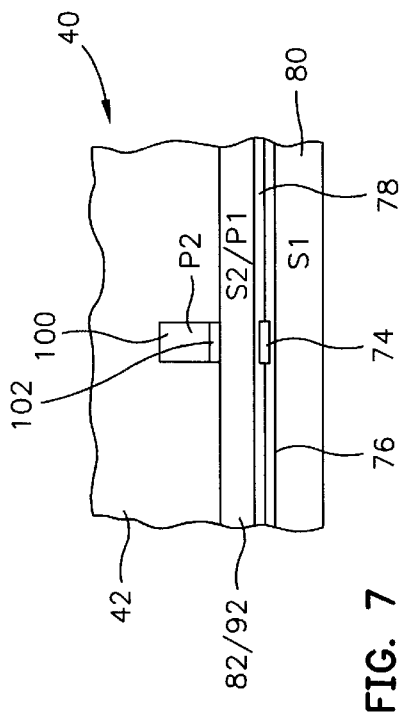
FIG. 7 is a partial ABS view of the slider taken along plane 7—7 of FIG. 6 to show the read and write elements of the magnetic head.

FIG. 6 is a side cross-sectional elevation view of the merged MR head 40, which includes a write head portion 70 and a read head portion 72, the read head portion employing an AP pinned spin valve sensor 74 of the present invention. FIG. 7 is an ABS view of FIG. 6. The spin valve sensor 74 is sandwiched between first and second gap layers 76 and 78, and the gap layers are sandwiched between first and second shield layers 80 and 82. In response to external magnetic fields, the resistance of the spin valve sensor 74 changes. A sense current $I_S$ conducted through the sensor causes these resistance changes to be manifested as potential changes. These potential changes are then processed as readback signals by the processing circuitry 50 shown in FIG. 3.

Figure 8:
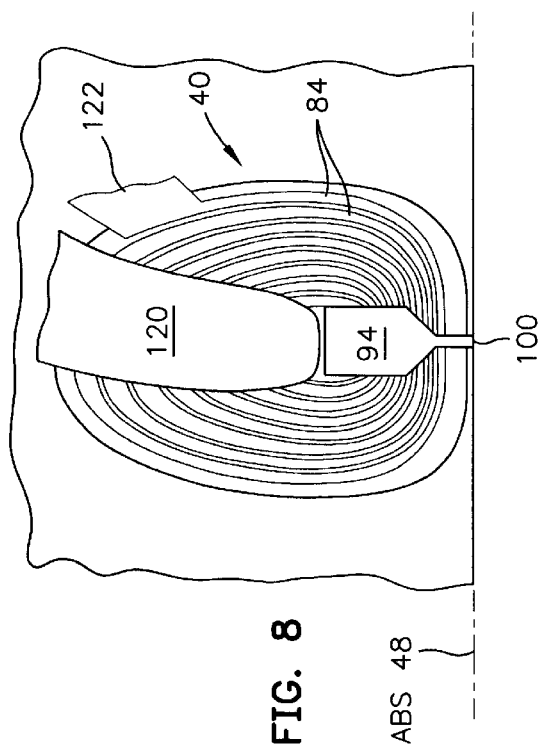
FIG. 8 is a view taken along plane 8—8 of FIG. 6 with all material above the write coil and write coil leads removed.

The write head portion of the merged MR head includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 8) to leads 124 and 126 on the suspension. In a merged head the second shield 82 for the read head 72 also serves as a first pole piece 92 for the write head 70. In a piggyback head these are separate layers.

Figure 9:
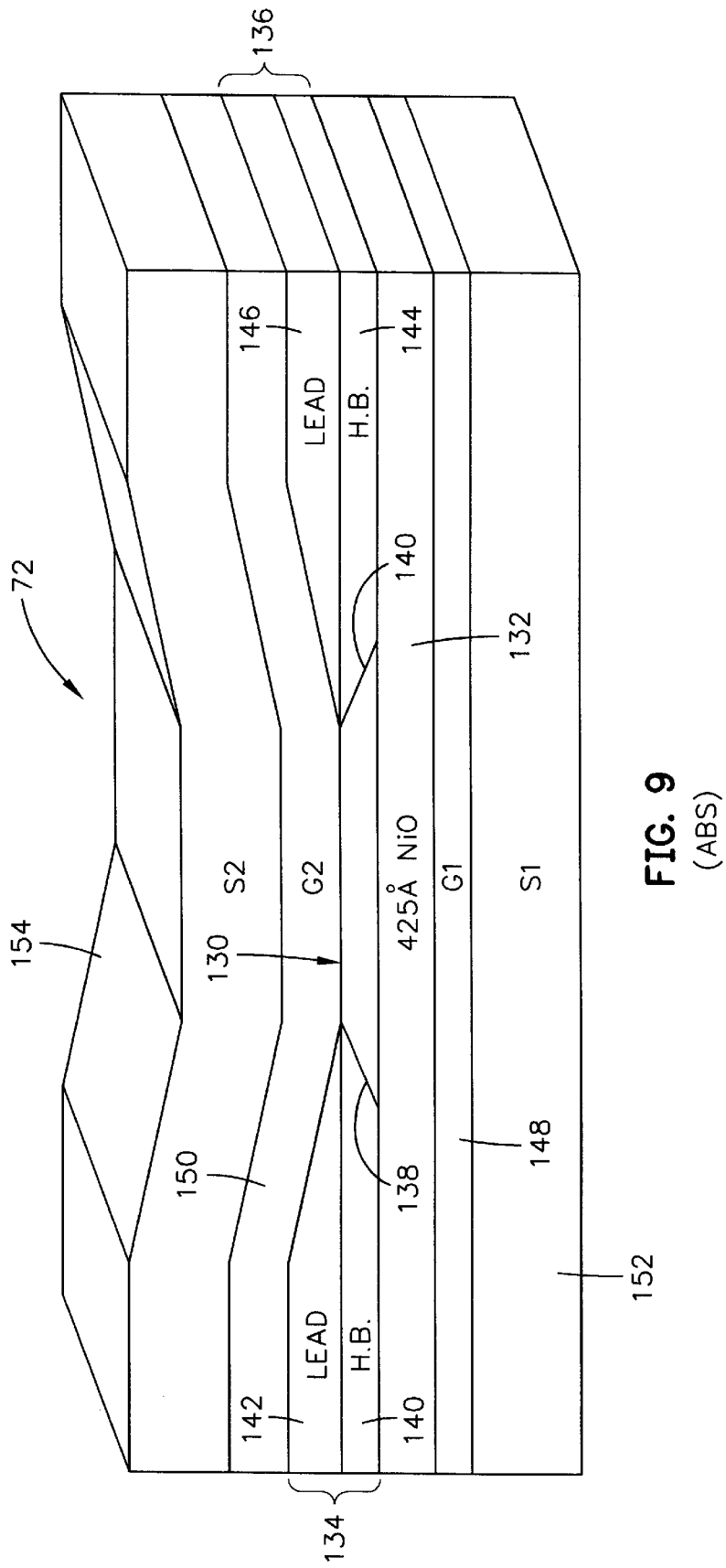
FIG. 9 is an isometric ABS illustration of a read sensor which employs a spin valve sensor of the present invention.

FIG. 9 is an isometric ABS illustration of the read head 72 shown in FIG. 6. The read head 72 has a spin valve sensor 130 which will be described in more detail hereinafter. First and second hard bias and lead layers 134 and 136 are connected to first and second side edges 138 and 140 of the spin valve sensor. This connection is known in the art as a contiguous junction and is ally described in commonly assigned U.S. Pat. No. 5,018,037 which is incorporated by reference herein. The first hard bias and lead layers include a first hard bias layer 140 and a first lead layer 142 and the second hard bias and lead layers 136 include a second hard bias layer 144 and a second lead layer 146. The hard bias layers 140 and 144 cause magnetic flux to extend longitudinally through the spin valve sensor 130 for stabilizing magnetic domains of the free layer. The spin valve sensor 130 and the first and second hard bias and lead layers 134 and 136 are located between nonmagnetic electrically insulative first and second read gap layers 148 and 150. The first and second gap layers 148 and 150 are, in turn, located between first and second shield layers 152 and 154.

First Investigation of a Simple Spin Valve Sensor

FIG. 10 shows a simple spin valve sensor 160 which includes a spacer layer (S) 162 of copper (Cu) between a pinned layer (P) 164 of cobalt (Co) and a free layer (F) 166 of nickel iron (NiFe). An interface layer 168 of nickel iron (NiFe) may be located between the pinned layer 164 and an antiferromagnetic (AFM) layer 170 of nickel oxide (NiO). The AFM layer 170 pins the magnetic moment of the pinned layer 164 in a direction perpendicular to the ABS. The interface layer 168 is employed for the purpose of promoting an exchange coupling between the antiferromagnetic layer 170 and the pinned layer 164. The free layer 166 has a magnetic moment that is directed substantially parallel to the ABS and rotates in response to applied fields from a rotating magnetic disk at various angles relative to the pinned direction of the magnetic moment of the pinned layer 164. A capping layer of tantalum (Ta) 172 is shown on the free layer 166. The thicknesses of the layers are exemplary and may be other thicknesses as desired. I have found that the cobalt pinned layer 164 has a low resistivity, in the order of 10 to 12 Ωcm, and a high coercivity (Hc) in the order of 50 to 200 Oe. It would be desirable if the resistivity of the pinned layer could be increased to reduce sense current shunting and if the corcivity of the pinned layer could be decreased so as to stabilize the direction of the moment of the pinned layer 164.

Present Simple Spin Valve Sensor

The present simple spin valve sensor 180 includes a spacer layer (S) 182 of copper (Cu) which is located between a pinned layer (P) 184 of cobalt iron niobium hafnium (CoFeNbHf) and a free layer (F) 186 of nickel iron. A giant magnetoresistive (GMR) enhancement layer 188 is located between the pinned layer 184 and the spacer layer 182 for the purpose of increasing the spin valve effect. It has been found that the GMR enhancement layer 188 interfaces the spacer layer 182 without intermixing therewith. An interface layer 190 is located between an antiferromagnetic layer (AFM) 192 and the pinned layer 184. The interface layer 190 serves the same function as the interface layer 168 in FIG. 10. The AFM layer 192 pins the magnetic moment of the interface layer 190 perpendicular to the ABS which, in turn, pins the magnetic moment of the pinned layer 184 perpendicular to the ABS. A capping layer 194 is located on the free layer 186 for protecting the free layer 186 from subsequent layers and subsequent processing steps. The cobalt iron niobium hafnium (CoFeNbHf) material employed for the pinned layer 184 has a resistivity of 110 ohms cm and a coercivity ($H_c$) of 5 to 10 Oe. This resistivity is significantly higher than the resistivity of the cobalt layer 164 in FIG. 10 and shunts considerably less of the sense current. Further, the significantly lower coercivity of 5 to 10 Oe, as compared to 50 to 200 Oe for the pinned layer 164 in FIG. 10, results in a more stable pinning of the magnetic moment of the pinned layer 184.

Second Investigation of AP Pinned Spin Valve Sensor

Figure 12:
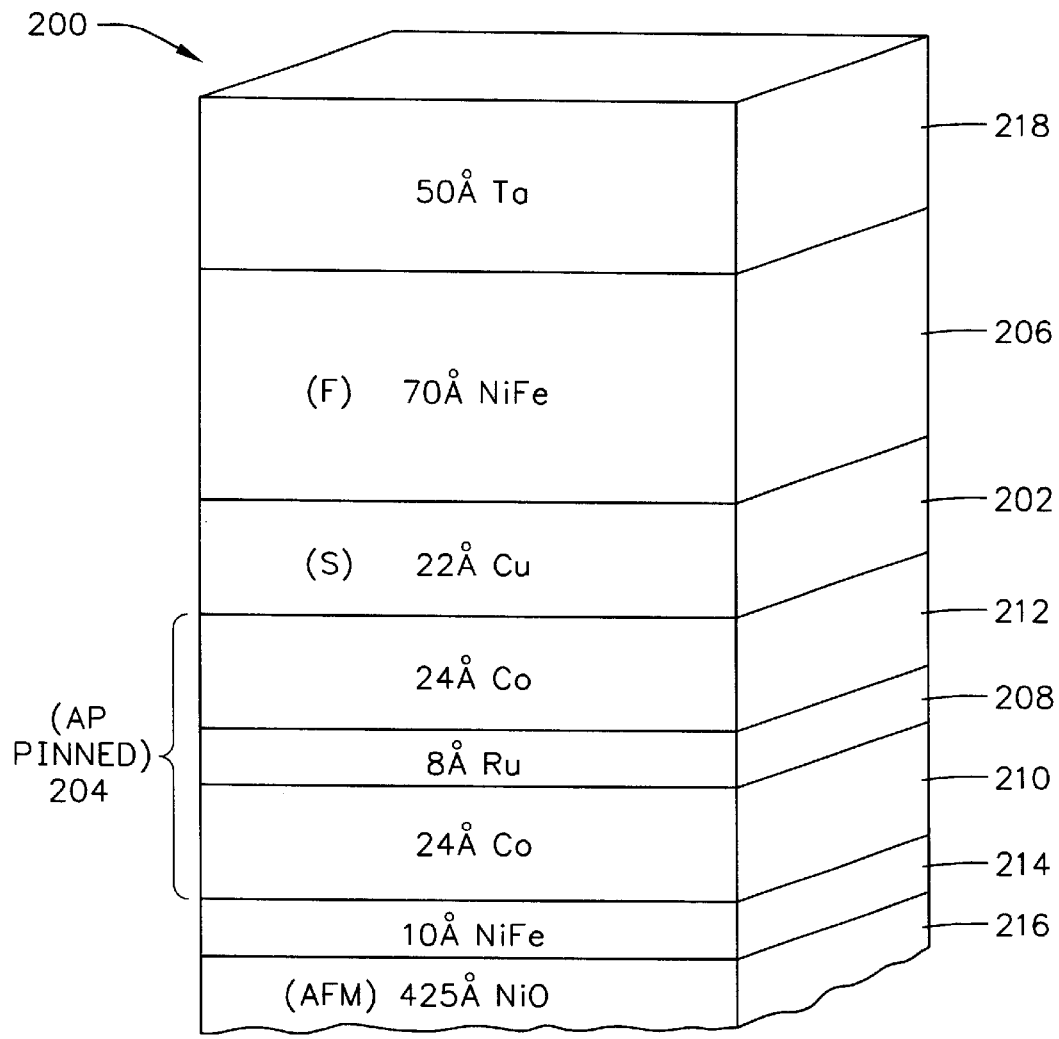
FIG. 12 is an isometric ABS illustration of a second investigated AP pinned spin valve sensor.

FIG. 12 shows an AP pinned spin valve sensor 200 investigated by me. The sensor 200 includes a spacer layer (S) 202 of copper (Cu) between an AP pinned layer 204 and a free layer (F) 206 of nickel iron (NiFe). The AP pinned layer 204 includes a ruthenium (Ru) layer 208 which is located between a first ferromagnetic layer 210 of cobalt and a second ferromagnetic layer 212 of cobalt. The thicknesses of each of the cobalt layers 210 and 212 may be 24 Å and the thickness of the ruthenium layer 208 may be 8 Å. An interface layer 214 of nickel iron (NiFe) is located between an antiferromagnetic layer (AFM) 216 of nickel oxide (NiO) and the first cobalt layer 210 of the AP pinned layer. A capping layer 218 is located on the free layer 206. The thicknesses of the layers shown in FIG. 12 are exemplary and may be changed as desired. I found that the first and second cobalt layers 210 and 212 exhibit low resistivity, in the order of 10 to 12 ohms cm, and high coercivity ($H_c$), in the order of 50 to 200 Oe. Accordingly, the cobalt layers 210 and 212 shunt a significant amount of the sense current due to their low resistivity and can be magnetically unstable due to a coercivity ($H_c$) in the range of 50 to 200 Oe.

Various Embodiments of the Present AP Pinned Spin Valve Sensor

Figure 13:
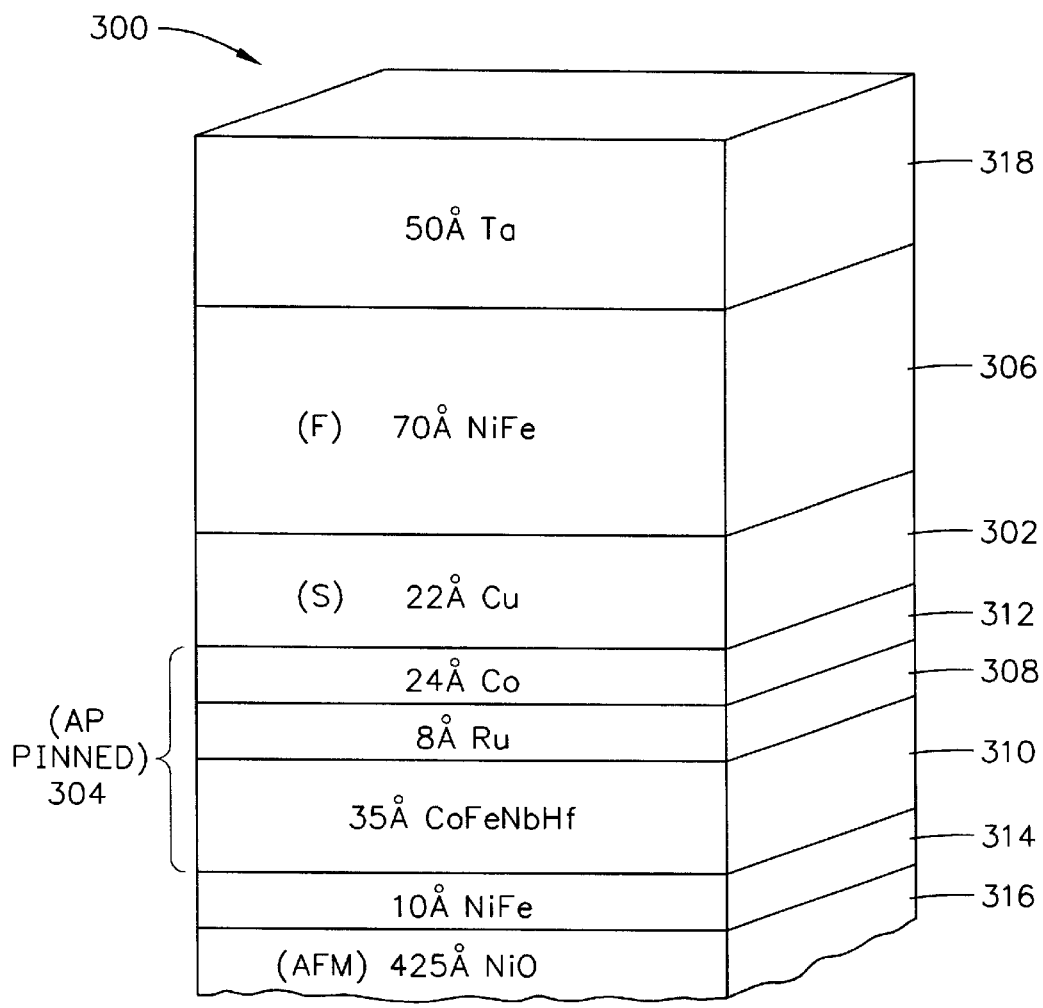
FIG. 13 is an isometric ABS illustration of a first embodiment of an AP pinned spin valve sensor of the present invention.

A first embodiment of the present AP pinned spin valve sensor 300 is shown in FIG. 13. The spin valve sensor 300 includes a spacer layer (S) 302 of copper (Cu) which is located between an AP pinned layer 304 and a free layer (F) 306 of nickel iron (NiFe). The AP pinned layer 304 includes a ruthenium (Ru) layer 308 which is located between a first ferromagnetic layer 310 of cobalt iron niobium hafnium (CoFeNbHf) and a second ferromagnetic layer 312 of cobalt (Co). The ruthenium (Ru) layer 308 maybe 8 Å thick, the cobalt iron niobium hafnium (CoFeNbHf) layer 310 may 35 Å thick and the cobalt (Co) layer 312 may be 24 Å thick. The cobalt iron niobium hafnium (CoFeNbHf) material of the layer 310 has a resistivity which is significantly higher than the resistivity of the cobalt layer 210 in FIG. 12 and has a coercivity ($H_c$) which is significantly lower than the coercivity of the cobalt layer 210 in FIG. 12. Accordingly, the layer 310 shunts very little of the sense current and is magnetically more stable than the cobalt layer 210 in FIG. 12. The cobalt layer 312 serves a double function, namely serving as a pinned layer for scattering of conduction electrons upon rotation of the free layer 306 and serving as a GMR enhancement layer because of its interfacing with the spacer layer 302, as discussed in regard to the embodiment 180 in FIG. 11. Accordingly, in the embodiment 300 in FIG. 13 the cobalt iron niobium hafnium (CoFeNbHf) is employed for only one of the ferromagnetic pinned layers of the AP pinned layer 304. The AP pinned spin valve sensor 300 in FIG. 13 further includes an interface layer 314 which is located between an antiferromagnetic (AFM) layer 316 of nickel oxide (NiO). A capping layer 318 of tantalum (Ta) may be employed on top of the free layer 306. Again, the thicknesses shown for the various layers are exemplary and may be changed as desired.

Figure 14:
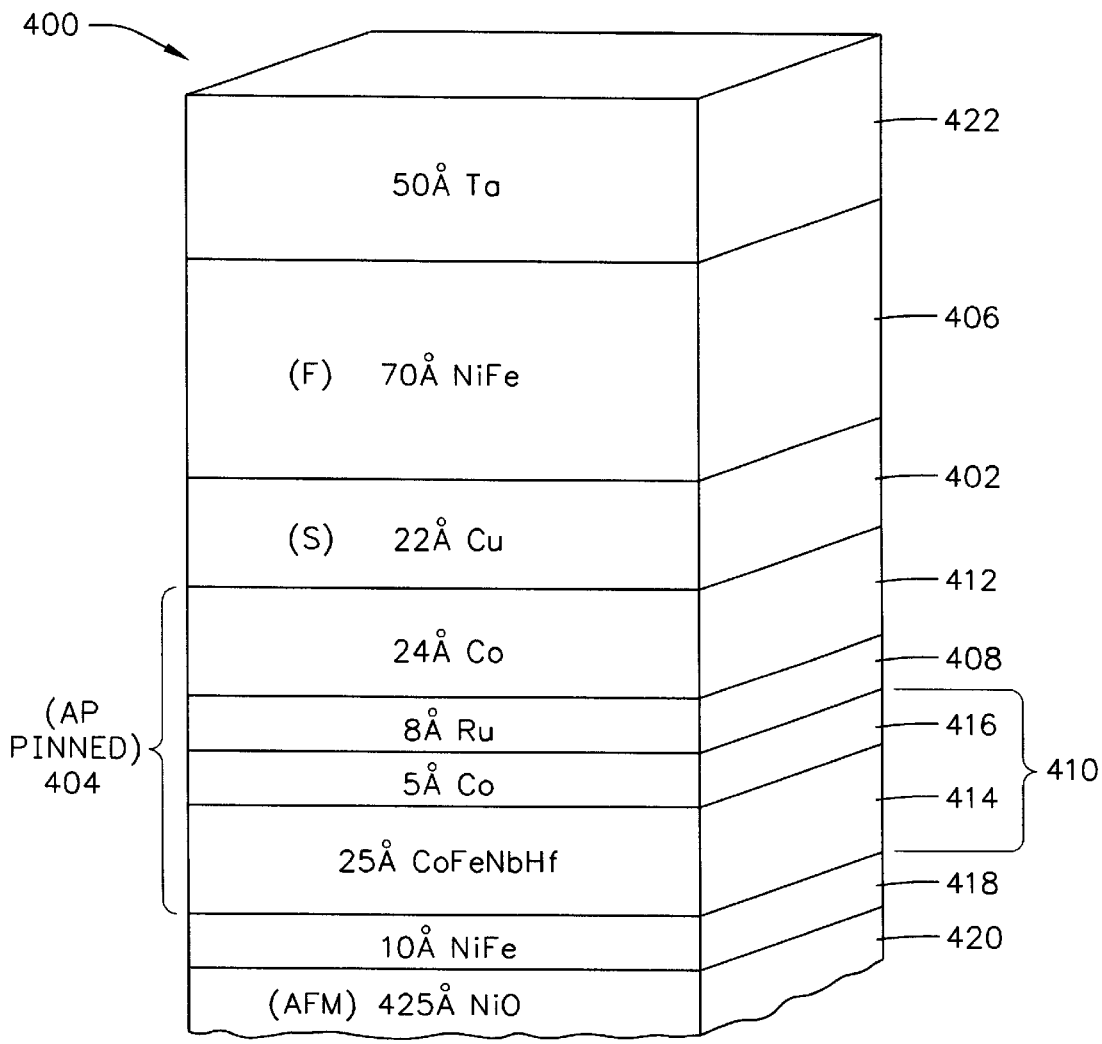
FIG. 14 is an isometric ABS illustration of a second embodiment of the present AP pinned spin valve sensor.

A second embodiment of the present AP pinned spin valve sensor 400 is shown in FIG. 14. In this embodiment a spacer layer (S) 402 of copper (Cu) is located between an AP pinned layer 404 and a free layer (F) 406 of nickel iron (NiFe). The AP pinned layer 404 includes a ruthenium (Ru) layer 408 which is located between first and second ferromagnetic layers 410 and 412. The first ferromagnetic layer 410 includes a first film 414 of cobalt iron niobium hafnium (CoFeNbHf) and a second film 416 of cobalt (Co). The first film 414 may be 25 Å thick and the second film 416 may be 5 Å thick. The second ferromagnetic layer 412 is cobalt (Co) and may be 24 Å thick. The cobalt layer 416 of the first ferromagnetic layer 410 provides an improved interfacing between the cobalt iron niobium hafniium (CoFeNbHf) layer 414 and the ruthenium (Ru) layer 408. The cobalt iron niobium hafnium (CoFeNbHf) layer 414 reduces sense current shunting in the first ferromagnetic layer 410 and increases the magnetic stability thereof. In the same manner as the cobalt layer 312 in FIG. 13, the cobalt layer 412 in FIG. 14 serves a double function as a pinned layer and as an improved interface with the spacer layer (S) 402 for increasing the GMR effect. An interface layer 418 of nickel iron (NiFe) is located between the antiferromagnetic (AFM) layer 420 and the cobalt iron niobium hafnium (CoFeNbHf) film 414. A capping layer of tantalum (Ta) is located on the free layer (F) 406. The thicknesses shown for the various layers in FIG. 14 are exenplary and may be changed as desired.

Figure 15:
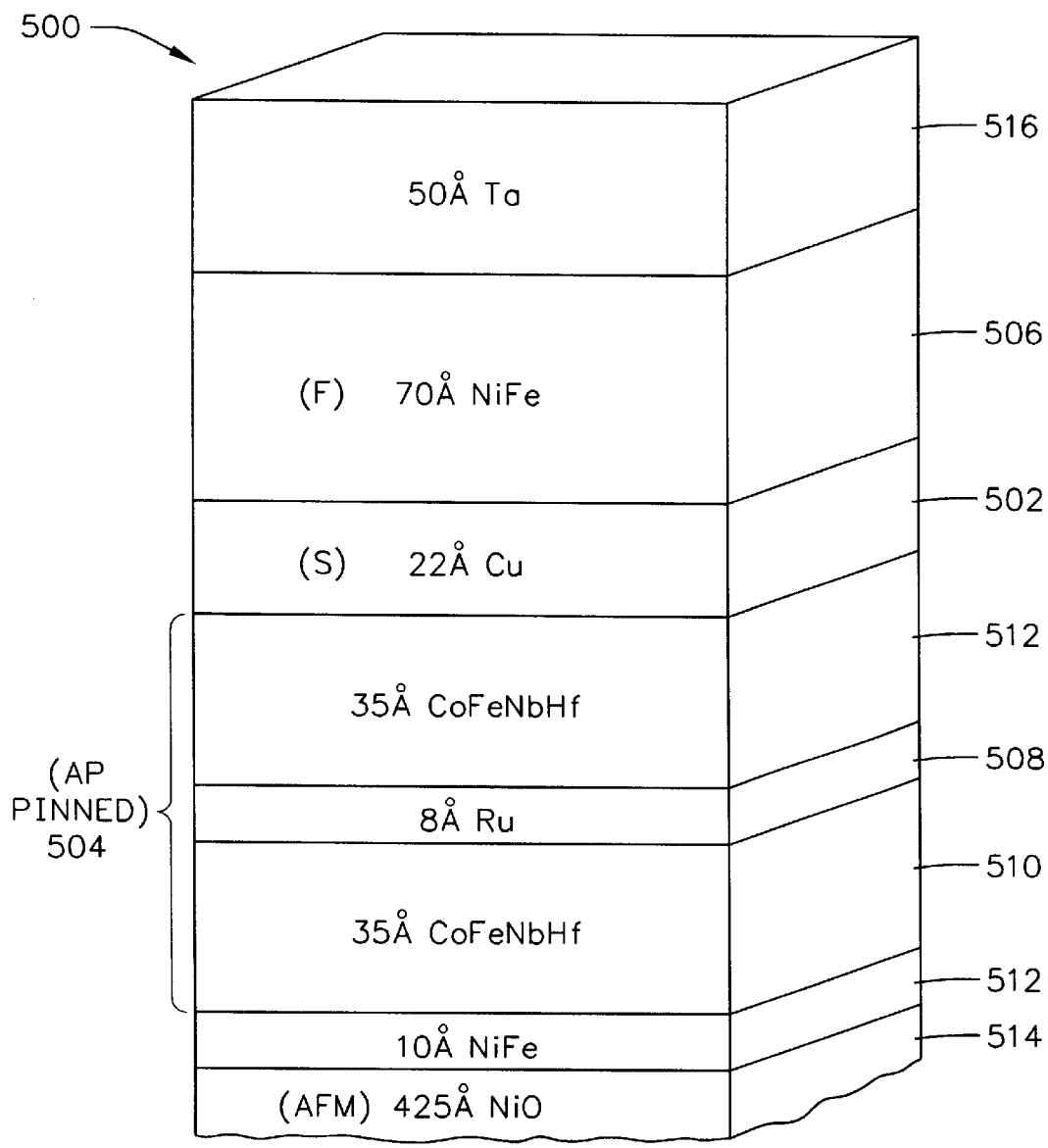
FIG. 15 is an isometric ABS illustration of a third embodiment of the present AP pinned spin valve sensor.

A third embodiment of the present AP pinned spin valve sensor 500 is illustrated in FIG. 15. This embodiment includes a spacer layer (S) 502 of copper (Cu) which is located between an AP pinned layer 504 and a free layer (F) 506 of nickel iron (NiFe). The AP pinned layer 504 includes a ruthenium (Ru) layer 508 which is located between a cobalt iron niobium hafnium (CoFeNbHf) layer 510 and a second cobalt iron niobium hafnium (CoFeNbHf) layer 512. The ruthenium layer 508 is 8 Å thick, the first layer 510 is 35 Å thick and the second layer 512 is 35 Å thick. The high resistivity of the first and second layers 510 and 512 is the best embodiment of the AP pinned layer 504 for reducing sense current shunting. Further, it is desirable to use the cobalt iron niobium hafnium (CoFeNbHf) material for both of the first and second ferromagnetic layers 510 and 512 of the AP pinned layer 504 for optimizing the stability of the magnetic moments of the layers 510 and 512. By employing the cobalt iron niobium hafiium (CoFeNbHf) material for the second ferromagnetic layer 512, a return of its magnetic moment to its original position is enabled in the same manner that the magnetic moment of the first ferromagnetic layer 510 is returned to its original position. Accordingly, in a preferred embodiment, cobalt iron niobium hafiium (CoFeNbHf) is utilized in the layers on each side of the ruthenium (Ru) layer 508. An interface layer 512 of nickel iron (NiFe) is employed between the antiferromagnetic (AFM) layer 514 and the cobalt iron niobium hafnium (CoFeNbHf) layer 510. A capping layer 516 is located on the free layer(F) 506.

Figure 16:
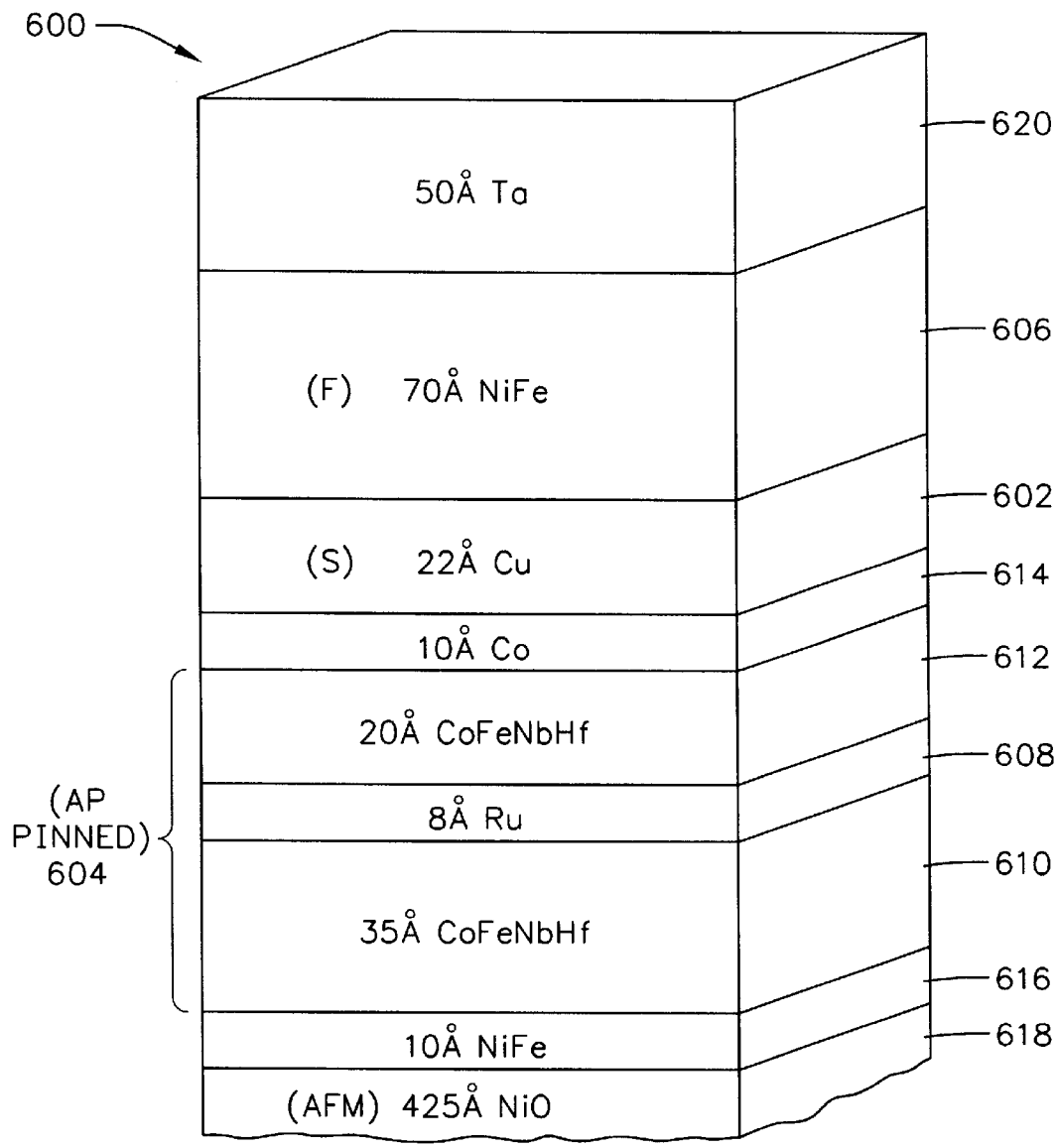
FIG. 16 is an isometric ABS illustration of a fourth embodiment of the present AP pinned spin valve sensor.

A fourth embodiment of the present AP pinned spin valve sensor 600 is illustrated in FIG. 16. This embodiment includes a spacer layer (S) 602 of copper (Cu) located between an AP pinned layer 604 and a free layer (F) 606 of nickel iron (NiFe). The AP pinned layer 604 includes a ruthenium layer (Ru) 608 which is located between a first ferromagnetic layer of cobalt iron niobium hafnium (CoFeNbHf) 610 and a second ferromagnetic layer of cobalt iron niobium hafnium (CoFeNbHf) 612. The thickness of the ruthenium (Ru) layer may be 8 Å thick, the thickness of the first ferromagnetic layer 610 may be 35 Å thick and the thickness of the second ferromagnetic layer 612 may be 20 Å thick. This embodiment has a similar advantage to the embodiment 500 shown in FIG. 15 in that the cobalt iron niobium hafium (CoFeNbHf) material is used for both the first and second ferromagnetic layers 610 and 612 for reducing sense current shunting and increasing the magnetic stability of both of the first and second ferromagnetic layers 610 and 612. In addition, however, a cobalt layer (Co) 614 is employed between the AP pinned layer 604 and the spacer (S) layer 602. The cobalt layer 614 serves as a GMR enhancement layer in the same manner as the layer 312 in FIG. 13 and the layer 412 in FIG. 14. An interface layer 616 of nickel iron (NiFe) is located between an antiferromagnetic (AFM) layer 618 and the first ferromagnetic layer 610 of the AP pinned layer. A capping layer 620 is located on the free layer (F) 606.

Figure 17:
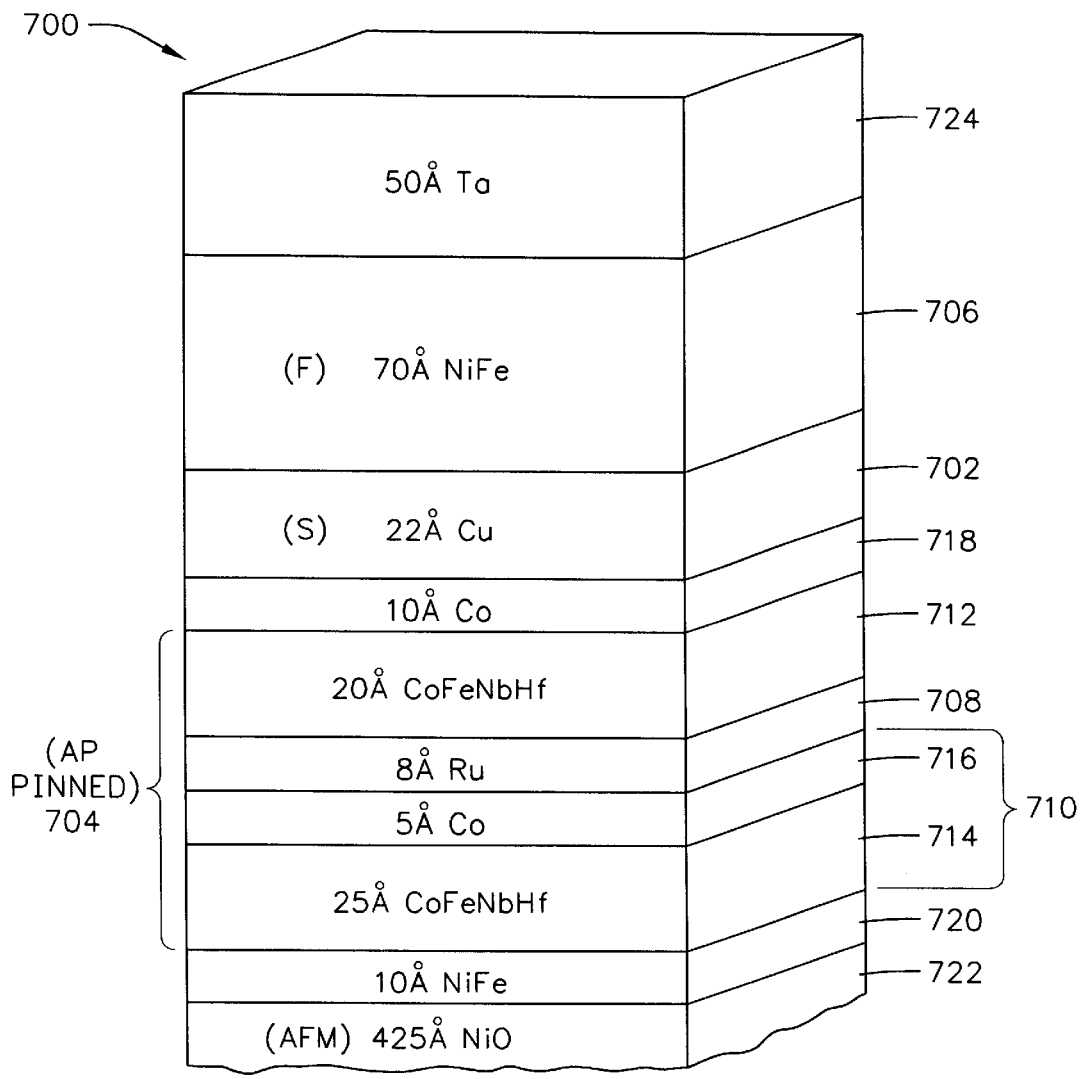
FIG. 17 is an isometric ABS illustration of a fifth embodiment of the present AP pinned spin valve sensor.

A fifth embodiment of the present AP pinned spin valve sensor 700 is shown in FIG. 17. This embodiment includes a spacer layer (S) 702 which is located between an AP pinned layer 704 and a free layer (F) 706 of nickel iron (NiFe). The AP pinned layer 704 includes a ruthenium (Ru) layer 708 between a first ferromagnetic layer 710 and a second ferromagnetic layer 712. The first ferromagnetic layer 710 includes a first film 714 of cobalt iron niobium hafnium (CoFeNbHf) and a second film 716 of cobalt (Co). The first film 714 may be 25 Å thick and the second film 716 may be 5 Å thick. The second ferromagnetic layer 712 is made from cobalt iron niobium hafnium (CoFeNbHf) and may be 20 Å thick. The AP pinned layer 704 in FIG. 17 has the same advantages as the AP pinned layer 604 in FIG. 16 regarding resistivity and coercivity. Further, the AP pinned layer 704 in FIG. 17 employs the second film 710 of cobalt (Co) between the first film 714 and the ruthenium (Ru) layer 708 because of its improved interfacing with each of the layers 714 and 708. A GMR enhancement layer 718 of cobalt (Co), which may be 10 Å thick, is located between the AP pinned layer 704 and the spacer layer (S) 702. This cobalt layer 718 provides improved interfacing with the layers 712 and 702 and increases the GMR effect. An interface layer 720 of nickel iron (NiFe) is employed between the antiferromagnetic (AFM) layer 722 of nickel oxide (NiO) and the first film 714 of the AP pinned layer 704.

Figure 18:
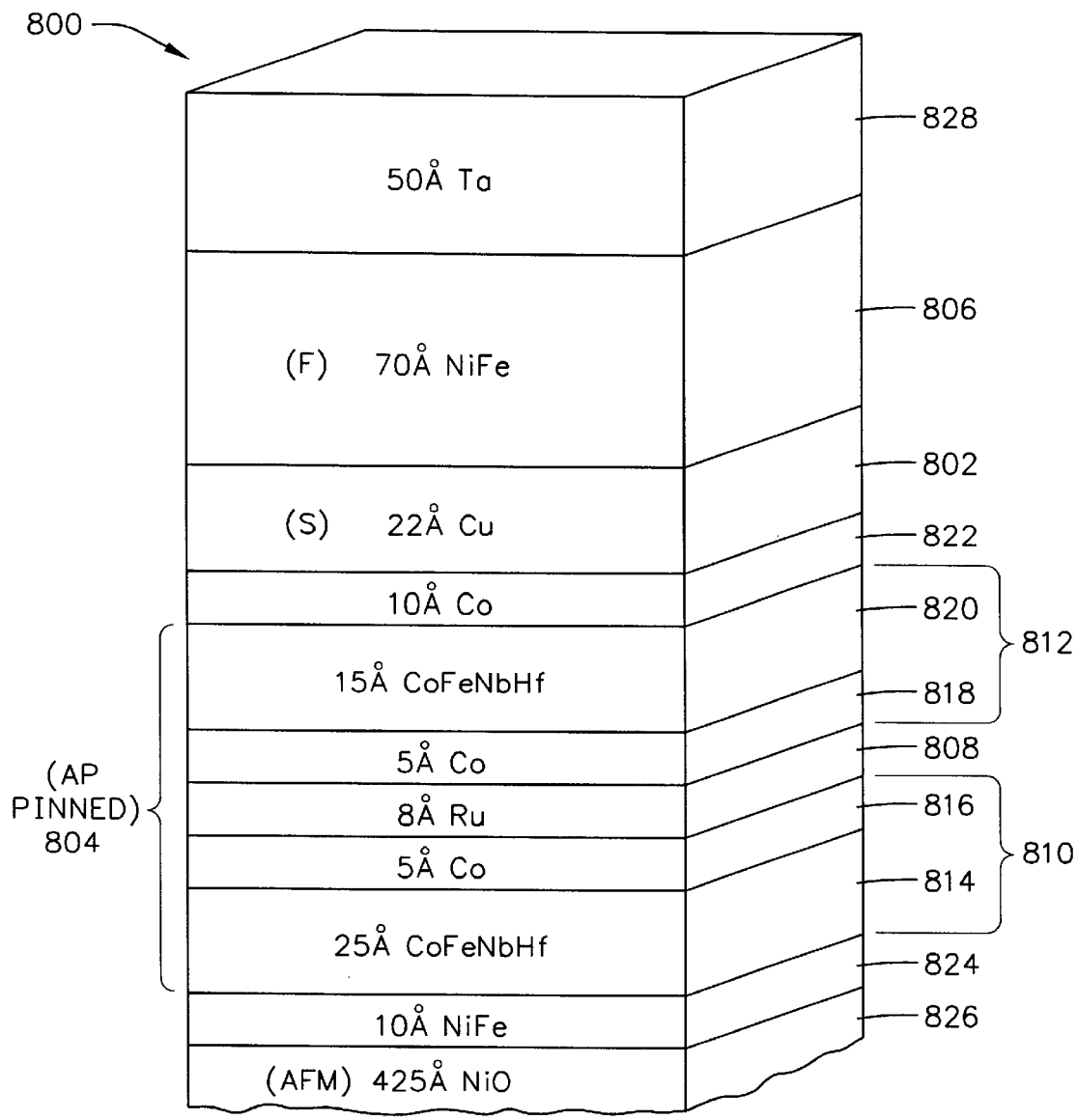
FIG. 18 is an isometric ABS illustration of a sixth embodiment of the present AP pinned spin valve sensor.

A sixth embodiment of the present AP pinned spin valve sensor 800 is shown in FIG. 18. This embodiment includes a spacer layer (S) of copper (Cu) 802 located between an AP pinned layer 804 and a free layer (F) 806 of nickel iron (NiFe). The pinned layer 804 includes a ruthenium (Ru) layer 808 located between first and second ferromagnetic layers 810 and 812. The first ferromagnetic layer 810 may include a first film 814 of cobalt iron niobium hafnium (CoFeNbHf) and a second film of cobalt (Co). The film 814 may be 25 Å thick and the second film 816 may be 5 Å thick. The second ferromagnetic layer 812 includes a first film 818 of cobalt (Co) and a second film 820 of cobalt iron niobium hafnium (CoFeNbHf). The first film 818 may be 5 Å thick and the second film 820 may be 15 Å thick. The AP pinned layer 804 in FIG. 18 has the advantage of high resistivity to prevent current shunting and low coercivity to promote magnetic stability because of the cobalt iron niobium hafnium (CoFeNbHf) material employed for the films 814 and 820. The AP pinned layer 804 has a further advantage by employing films 816 and 818 of cobalt (Co) on each side of the ruthenium (Ru) layer 808 for promoting a better interface between the layers. A GMR enhancement layer 822 of cobalt (Co) may be employed between the AP pinned layer 804 and the spacer layer (S) 802 for enhancing the GMR effect. The thickness of this layer may be 10 Å. An interface layer 824 of nickel iron (NiFe) is employed between the antiferromagnetic (AFM) layer 826 and the first film 814 of the AP pinned layer. A capping layer 828 of tantalum (Ta) may be employed on the free layer (F) 806. The thicknesses of the layers shown in FIG. 18 are exemplary and may be changed as desired.

Figure 19:
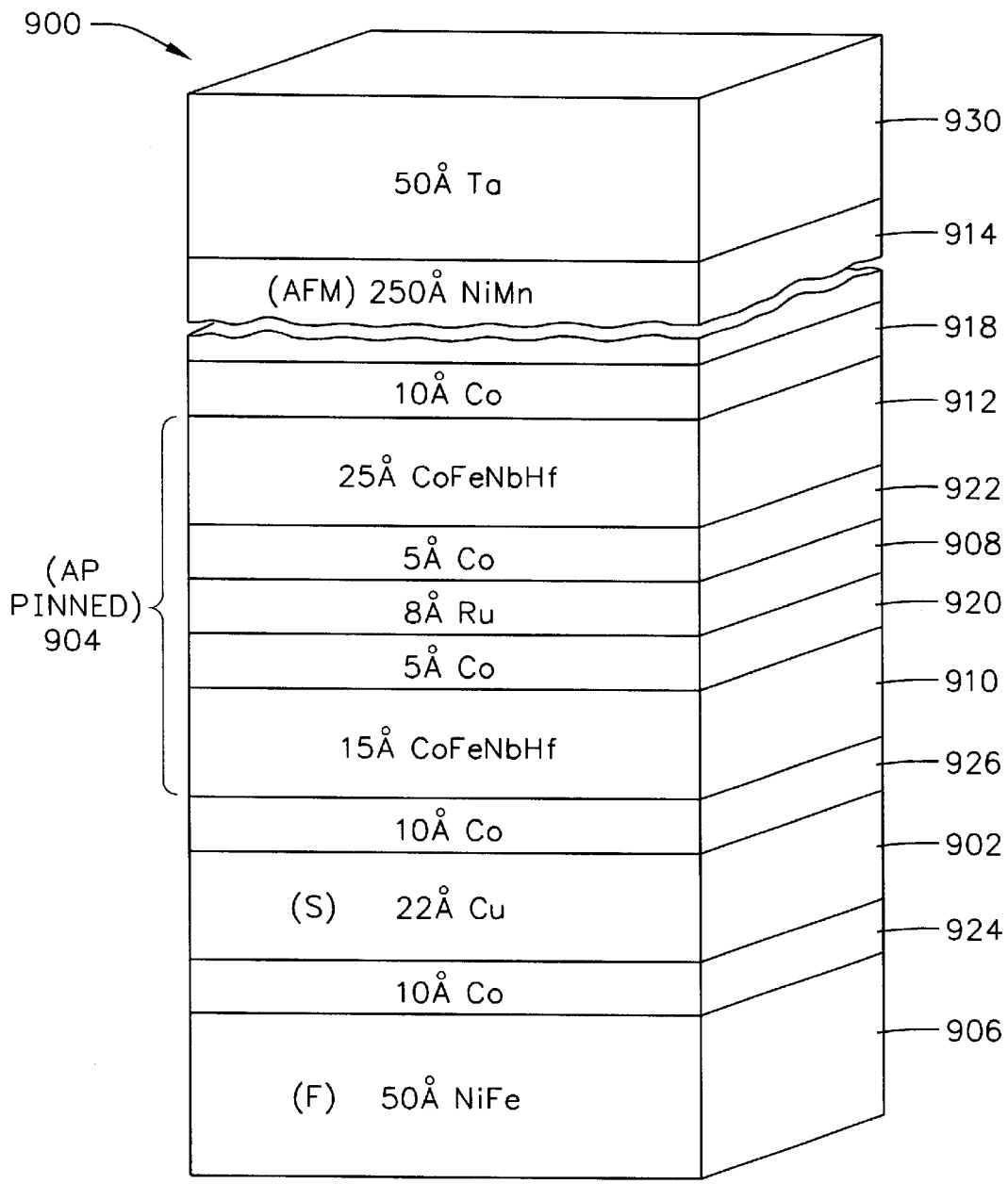
FIG. 19 is an isometric ABS illustration of a seventh embodiment of the present AP pinned spin valve sensor.

A seventh embodiment of the present AP pinned spin valve sensor 900 is shown in FIG. 19. This sensor 900 differs from the sensors shown in FIGS. 13–18 in that the sensor in FIG. 19 is a top spin valve sensor whereas the spin valve sensors in FIGS. 13–18 are bottom spin valve sensors. A top spin valve sensor has the pinning layer located at the top whereas a bottom spin valve sensor has the pinning layer located at the bottom. The embodiment in FIG. 19 includes a spacer layer (S) 902 of copper (Cu) which is located between an AP pinned layer 904 and a free layer (F) 906 of nickel iron (NiFe). The AP pinned layer 904 includes a ruthenium (Ru) layer 908 located between a cobalt iron niobium hafiium (CoFeNbHf) layer 910 and a cobalt iron niobium hafnium (CoFeNbHf) layer 912. The AP pinned layer 904 in FIG. 19 will have the same advantages as the pinned layer 504 in FIG. 15 by providing high resistivity to lessen current shunting and low coercivity to promote magnetic stability of the AP pinned layer. An antiferromagnetic layer (AFM) 914 of nickel manganese (NiMn) is exchange coupled to the cobalt iron niobium hafnium (CoFeNbHf) layer 912 for pinning its magnetic moment perpendicular to the ABS.

A tantalum layer 930 is located adjacent the antiferromagnetic (AFM) layer 914. The embodiment 900 is shown for the purpose of illustrating that any one of the embodiments in FIGS. 13–18 may be a top spin valve sensor instead of a bottom spin valve sensor and still employ the concepts of the present invention. The thicknesses shown for the various layers in FIG. 19 are exemplary and may be changed as desired.

An interface layer of cobalt (Co) 918 may be located between the AFM layer 914 and the film 912 of the AP pinned layer for providing a better exchange coupling between the layers 914 and 912. Accordingly, the AFM layer 914 is exchange coupled to the interface layer 918 which is, in turn, exchange coupled to the layer 912. Further, interface layers 920 and 922 of the AP pinned layer 904 may interface the ruthenium (Ru) layer 908 and the first and second cobalt iron niobium hafnium (CoFeNbHf) layers 910 and 912 for promoting exchange coupling between these layers. GMR enhancement layers 924 and 926 may be employed for interfacing the spacer layer 902 and a respective one of the free layer 906 and the first ferromagnetic layer 910 of cobalt iron niobium hafnium (CoFeNbHf) 910 of the AP pinned layer.

Figure 20:
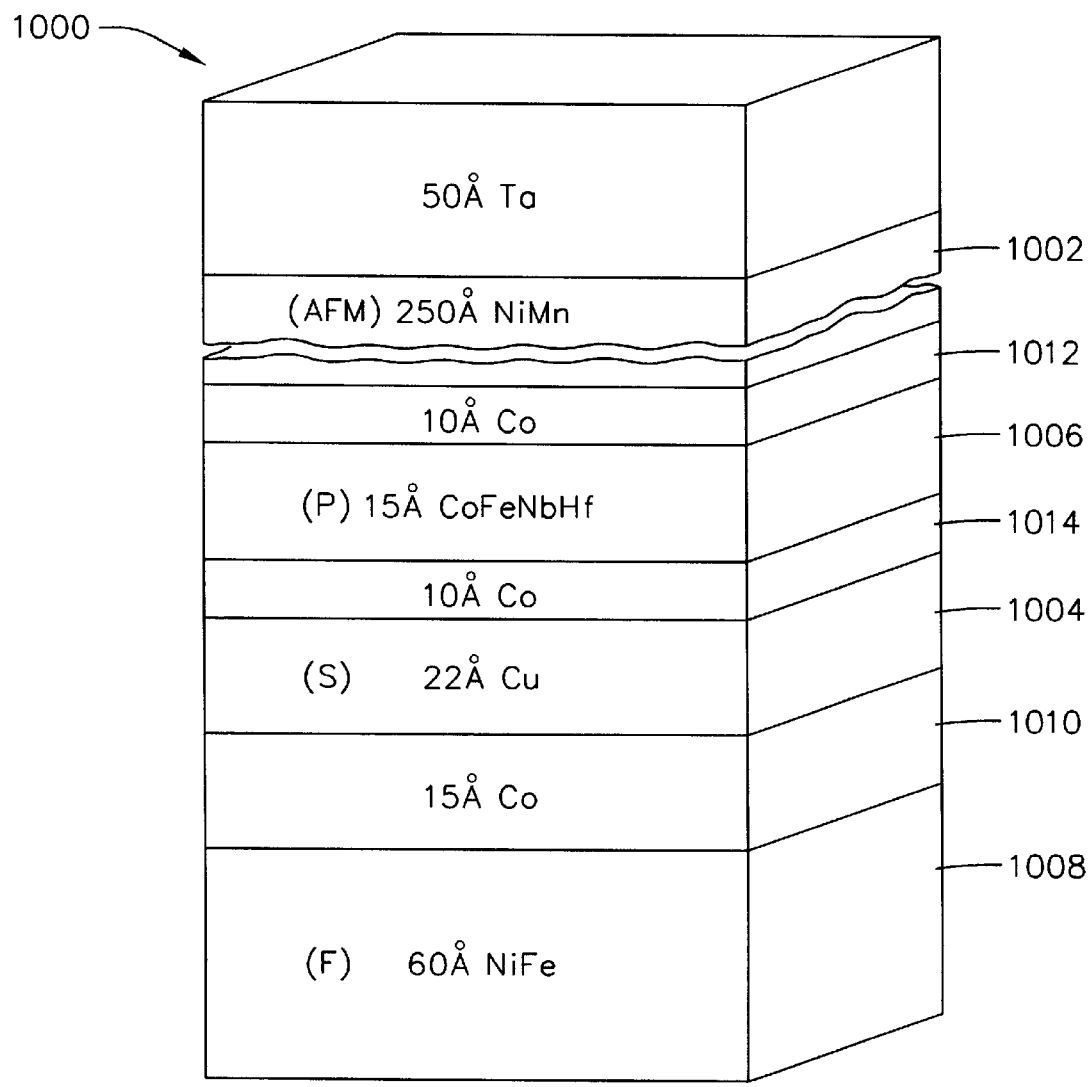
FIG. 20 is an ABS illustration of a top simple spin valve sensor employing the present invention.

An exemplary top simple spin valve 1000 is illustrated in FIG. 20 wherein the antiferromagnetic layer (AFM) 1002 of nickel manganese (NiMn) is located at the top of the spin valve structure. A spacer layer 1004 of copper (Cu) is located between a pinned layer (P) 1006 of cobalt iron niobium hafnium (CoFeNbHf) and a free layer (F) 1008 of nickel iron (NiFe). A GMR enhancement layer 1010 of cobalt (Co) may be employed between the free layer 1008 and the spacer layer 1004 for enhancing the GMR effect. An interface layer 1012 of cobalt (Co) may be employed between the AFM layer 1002 and the pinned layer 1006 for improving the exchange coupling between these layers and an interface layer 1014 of cobalt (Co) may be employed between the pinned layer 1006 and the spacer layer 1004. The thicknesses for the various layers shown in FIG. 20 are exemplary and may be changed as desired.

Alternatives of the Present Invention

Other materials that may be substituted for the cobalt iron niobium hafnium (CoFeNbHf) material for the various layers described in FIGS. 11 and 13–19 are cobalt niobium hafnium (CoNbHf), cobalt iron niobium (CoFeNb) and cobalt iron hafnium (CoFeHf). Other materials suitable for the cobalt (Co) layers described in FIGS. 11 and 13–19 are cobalt iron (CoFe) and cobalt iron boron (CoFeB). The preferred atomic weight percentages for the cobalt iron niobium hafnium (CoFeNbHf) material are 86.5/0.5/11/2. The nickel iron layers are preferably $Ni_{80}Fe_{20}$.

Clearly, other embodiments and modifications of this invention will occur readily to those of ordinary skill in the art in view of these teachings. For instance, the spin valve sensor may be employed for purposes other than in a magnetic disk drive, such as a tape drive search and/or surveillance devices and laboratory equipment. Therefore, this invention is to be limited only by the following claims, which include all such embodiments and modifications when viewed in conjunction with the above specification and the accompanying drawings.

I claim:
1. A spin valve sensor comprising:
   an antiferromagnetic pinning layer;
   an antiparallel (AP) pinned layer structure that includes:
      first and second ferromagnetic layers wherein the first ferromagnetic layer is exchange coupled to the pinning layer and has a magnetic moment pinned in a first direction;
      a ruthenium spacer layer located between the first and second ferromagnetic layers so that the second ferromagnetic layer has a magnetic moment that is pinned in a second direction that is antiparallel to said first direction;
      the first ferromagnetic layer including first and second films, the first film being selected from the group consisting of cobalt iron niobium hafnium (CoFeNbHf), cobalt iron niobium (CoFeNb), cobalt iron hafnium (CoFeHf) and cobalt niobium hafnium (CoNbHf) and the second film being selected from the group consisting of cobalt (Co), cobalt iron (CoFe) and cobalt iron boron (CoFeB) and being located between the first film and the ruthenium (Ru) spacer layer; and
      the second ferromagnetic layer being selected from the group consisting of cobalt (Co), cobalt iron (CoFe) and cobalt iron boron (CoFeB); a nonmagnetic electrically conductive spacer layer;
   a ferromagnetic free layer that has a magnetic moment that is free to rotate in response to applied fields; and
   the spacer layer being located between the pinned layer and the free layer.
2. A spin valve sensor as claimed in claim 1 wherein the first film is cobalt iron niobium hafnium (CoFeNbHf).
3. A spin valve sensor as claimed in claim 2 including:
   the pinning layer being nickel oxide (NiO); and
   an interface layer of nickel iron (NiFe) having first and second surfaces, the first surface being exchange coupled to the pinning layer and the second surface being exchange coupled to the first film.
4. A magnetic head that has an air bearing surface (ABS) comprising:
   a read head that includes:
      first and second ferromagnetic shield layers:
      first and second nonmagnetic electrically insulative gap layers located between the first and second ferromagnetic shield layers;
      a spin valve sensor responsive to applied magnetic fields;
      the spin valve sensor being located between the first and second gap layers; and
      first and second electrically conductive lead layers located between the first and second gap layers and connected to the spin valve sensor for conducting a sense current through the spin valve sensor;
   the spin valve sensor including:
      an antiferromagnetic pinning layer;
      an antiparallel (AP) pinned layer structure that includes:
         first and second ferromagnetic layers wherein the first ferromagnetic layer is exchange coupled to the pinning layer and has a magnetic moment pinned in a first direction;

a ruthenium spacer layer located between the first and second ferromagnetic layers so that the second ferromagnetic layer has a magnetic moment that is pinned in a second direction that is antiparallel to said first direction;

the first ferromagnetic layer including first and second films, the first film being selected from the group consisting of cobalt iron niobium hafnium (CoFeNbHf), cobalt iron niobium (CoFeNb), cobalt iron hafnium (CoFeHf) and cobalt niobium hafnium (CoNbHf) and the second film being selected from the group consisting of cobalt (Co), cobalt iron (CoFe) and cobalt iron boron (CoFeB) and being located between the first film and the ruthenium (Ru) spacer layer; and the second ferromagnetic layer being selected from the group consisting of cobalt (Co), cobalt iron (CoFe) and cobalt iron boron (CoFeB);

a free layer that has a magnetic moment that is free to rotate relative to the second direction of the AP pinned layer in response to an applied field;

a nonmagnetic electrically conductive first spacer layer; and the first spacer layer being located between the free layer and the AP pinned layer.

5. A magnetic head as claimed in claim 4 wherein the first film is cobalt iron niobium hafnium (CoFeNbHf).

6. A magnetic head as claimed in claim 5 including:

the pinning layer being nickel oxide (NiO); and an interface layer of nickel iron (NiFe) having first and second surfaces, the first surface being exchange coupled to the pinning layer and the second surface being exchange coupled to the first film.

7. A magnetic disk drive that includes at least one magnetic head that has an air bearing surface (ABS), the disk drive comprising:

the magnetic head including a combined read head and write head;

the read head including:
first and second ferromagnetic shield layers:
first and second nonmagnetic electrically insulative gap layers located between the first and second ferromagnetic shield layers;
a spin valve sensor responsive to applied magnetic fields;
the spin valve sensor being located between the first and second gap layers; and
first and second electrically conductive lead layers located between the first and second gap layers and connected to the spin valve sensor for conducting a sense current through the spin valve sensor;

the spin valve sensor including:
an antiferromagnetic pinning layer;
an antiparallel (AP) pinned layer structure that includes:
first and second ferromagnetic layers wherein the first ferromagnetic layer is exchange coupled to the pinning layer and has a magnetic moment pinned in a first direction;
a ruthenium spacer layer located between the first and second ferromagnetic layers so that the second ferromagnetic layer has a magnetic moment that is pinned in a second direction that is antiparallel to said first direction;
the first ferromagnetic layer including first and second films, the first film being selected from the group consisting of cobalt iron niobium hafnium (CoFeNbHf), cobalt iron niobium (CoFeNb), cobalt iron hafnium (CoFeHf) and cobalt niobium hafnium (CoNbHf) and the second film being selected from the group consisting of cobalt (Co), cobalt iron (CoFe) and cobalt iron boron (CoFeB) and being located between the first film and the ruthenium (Ru) spacer layer; and
the second ferromagnetic layer being selected from the group consisting of cobalt (Co), cobalt iron (CoFe) and cobalt iron boron (CoFeB);
a free layer that has a magnetic moment that is free to rotate relative to the second direction of the AP pinned layer in response to an applied field;
a nonmagnetic electrically conductive first spacer layer;
the first spacer layer being located between the free layer and the AP pinned layer;

the write head including:
first and second pole piece layers and a write gap layer;
the first and second pole piece layers being separated by the write gap layer at the ABS and connected at a back gap that is recessed rearwardly in the head from the ABS;
an insulation stack having at least first and second insulation layers;
at least one coil layer embedded in the insulation stack;
the insulation stack and the at least one coil layer being located between the first and second pole piece layers; and
the second shield layer and the first pole piece layer being a common layer;

a housing;

a magnetic disk rotatably supported in the housing;

a support mounted in the housing for supporting the magnetic head with its ABS facing the magnetic disk so that the magnetic head is in a transducing relationship with the magnetic disk;

means for rotating the magnetic disk;

positioning means connected to the support for moving the magnetic head to multiple positions with respect to said magnetic disk; and processing means connected to the magnetic head, to the means for rotating the magnetic disk and to the positioning means for exchanging signals with the merged magnetic head, for controlling movement of the magnetic disk and for controlling the position of the magnetic head.

8. A magnetic disk drive as claimed in claim 7 wherein the first film is cobalt iron niobium hafnium (CoFeNbHf).

9. A magnetic disk drive as claimed in claim 8 including:

the pinning layer being nickel oxide (NiO); and an interface layer of nickel iron (NiFe) having first and second surfaces, the first surface being exchange coupled to the pinning layer and the second surface being exchange coupled to the first film.

10. A method of making a combined read and write head that has an air bearing surface (ABS) comprising:

a making of the read head including:
forming a ferromagnetic first shield layer;
forming a nonmagnetic electrically insulative first gap layer on the first shield layer;
forming a spin valve sensor on the first gap layer as follows:
forming a ferromagnetic pinning layer;

forming an antiparallel (AP) pinned layer structure
that includes:
  forming first and second ferromagnetic layers
    wherein the first ferromagnetic layer is
    exchange coupled to the pinning layer and has
    a magnetic moment pinned in a first direction;
  forming a ruthenium spacer layer between the
    first and second ferromagnetic layers so that
    the second ferromagnetic layer has a magnetic
    moment that is pinned in a second direction
    that is antiparallel to said first direction;
  forming the first ferromagnetic layer including
    first and second films with the first film being
    formed of cobalt iron niobium hafnium
    (CoFeNbHf), cobalt iron niobium (CoFeNb),
    cobalt iron hafnium (CoFeHf) and cobalt niobium hafnium (CoNbHf) and the second film
    being formed from the group consisting of
    cobalt (Co), cobalt iron (CoFe) and cobalt iron
    boron (CoFeB) and located between the first
    film and the ruthenium (Ru) spacer layer; and
  forming the second ferromagnetic layer from the
    group consisting of cobalt (Co), cobalt iron
    (CoFe) and cobalt iron boron (CoFeB);
forming a nonmagnetic electrically conductive first
  spacer layer on the second ferromagnetic layer of
  the AP pinned layer structure;
forming a ferromagnetic free layer on the first spacer
  layer that has a magnetic moment that is free to
  rotate relative to the second direction of the AP
  pinned layer in response to an applied field;
forming first and second electrically conductive lead
  layers on the first gap layer that are connected to
  the sensor;
forming a nonmagnetic electrically insulative second
  gap layer on the sensor, the lead layers and the first
  gap layer; and
forming a ferromagnetic second shield layer on the
  second gap layer;
a making of the write head including:
  forming a write gap layer and an insulation stack with
    a coil layer embedded therein on the second shield
    layer so that the second shield layer also functions as
    a first pole piece for the write head; and
  forming a second pole piece layer on the insulation
    stack and the write gap and connected at a back gap
    to the first pole piece.

11. A method as claimed in claim 10 wherein the first film is cobalt iron niobium hafnium (CoFeNbHf).

12. A method as claimed in claim 11 including:

the pinning layer being nickel oxide (NiO); and an interface layer of nickel iron (NiFe) having first and second surfaces, the first surface being exchange coupled to the pinning layer and the second surface being exchange coupled to the first film.

\* \* \* \* \*